United States Patent
Brofman et al.

[11] Patent Number: 6,070,782
[45] Date of Patent: Jun. 6, 2000

[54] SOCKETABLE BUMP GRID ARRAY SHAPED-SOLDER ON COPPER SPHERES

[75] Inventors: Peter Jeffrey Brofman, Hopewell Junction; Balaram Ghosal; Raymond Alan Jackson, both of Fishkill; Kathleen Ann Lidestri, Hopewell Junction; Karl J. Puttlitz, Sr., Wappingers Falls; William Edward Sablinski, Beacon, all of N.Y.

[73] Assignee: International Business Machines Corporation, Armonk, N.Y.

[21] Appl. No.: 09/113,044

[22] Filed: Jul. 9, 1998

Related U.S. Application Data

[60] Provisional application No. 08/674,559, Jul. 2, 1996, Pat. No. 5,868,304.

[51] Int. Cl.[7] .......................... B23K 101/38; H05K 1/00; H01L 23/48
[52] U.S. Cl. ........................ 228/56.3; 257/693; 439/74
[58] Field of Search ................... 228/56.3, 44.7, 228/49.5, 189, 246; 257/690, 692, 693; 361/743; 439/74; 29/843, 879; 428/198, 403

[56] References Cited

U.S. PATENT DOCUMENTS

| | | | |
|---|---|---|---|
| 4,545,610 | 10/1985 | Lakritz et al. | 29/589 |
| 4,750,092 | 6/1988 | Wether . | |
| 5,060,844 | 10/1991 | Behun et al. . | |
| 5,093,986 | 3/1992 | Mandai et al. | 29/843 |
| 5,118,027 | 6/1992 | Braun et al. . | |
| 5,324,569 | 6/1994 | Nagesh et al. | 428/198 |
| 5,431,328 | 7/1995 | Chang et al. | 228/180.22 |
| 5,492,266 | 2/1996 | Hoebener et al. | 228/248.1 |

FOREIGN PATENT DOCUMENTS 07099385  4/1995  Japan .

OTHER PUBLICATIONS

SLT Device Metallurgy And Its Monolithic Extension, by P. A. Totta and R.P. Sopher, *IBM Journal of Research Development*, vol. 3, May 1969, pp. 226–238.

Copper Ball Standoff For Surface–Mounted Attachment Of MLC Substrates On Laminates, *IBM Technical Disclosure Bulletin*, vol. 28, No. 4, Sep. 1986, p. 1646.

*Primary Examiner*—Samuel M. Heinrich
*Attorney, Agent, or Firm*—DeLio & Peterson LLC; John J. Tomaszewski; Aziz M. Ahsan

[57] ABSTRACT

An electronic component having a socketable bump grid array comprising shaped-solder coated metallic spheres is provided by a method which comprises positioning solder coated metal spheres in an aligning device having a plurality of openings corresponding to the array, the openings being tapered preferably in the form of a truncated cone with the base of the cone being at the upper surface of the aligning device and having a diameter larger than the diameter of the solder coated metal sphere. The opening is configured so that a sphere positioned in the opening extends partially above the upper surface of the aligning device. The pads of the substrate are then contacted with the positioned spheres and, when the solder is reflowed, the solder forms a bond between the conductive layer on the substrate in contact with the solder-coated metal sphere and takes the shape of the aligning device and which maintains a solder coating on the whole surface of the metal sphere. An apparatus is also provided for making such a socketable bump grid array.

5 Claims, 2 Drawing Sheets

SOCKETABLE BUMP GRID ARRAY SHAPED-SOLDER ON COPPER SPHERES

This is a continuation divisional of copending application(s) Ser. No. 08/674,559 filed on Jul. 2, 1996, now U.S. Pat. No. 5,868,304.

BACKGROUND OF THE INVENTION

1. Field of the Invention

This invention relates generally to electrically connecting one electronic component to another electronic component and, in particular, to providing a socketable bump grid array comprising shaped solder-coated metal spheres attached to one of the components which shaped solder-coated metal spheres are pluggable into sockets of the electronic component to be connected thereto.

2. Description of Related Art

Forming an electronic package whereby an electrical component such as an integrated circuit chip is electrically connected to a substrate such as a card, a board, another chip or any other electronic part is well-known in the art. Surface mount technology (SMT) has gained acceptance as the preferred means of joining electronic devices together, particularly in high end computers. As compared to more traditional pin connection methods, where a pin mounted to the backside of a ceramic module is thrust through a hole in the board, twice the number of modules can be placed on the same board area using SMT.

A myriad of solder structures have been proposed for the surface mounting of one electronic structure to another. Typical surface mount processes form the solder structures by screening solder paste on conductive, generally metallic pads exposed on the surface of a first electronic structure or substrate. A stencil printing operation is used to align the contact mask to the pads. The solder paste areas on the screened substrate are then aligned to corresponding pads on the electronic structure or board to be connected. After alignment, the substrate and board go through a reflow operation to melt the solder paste and create a solder bond between the corresponding pads on the substrate and board.

Other known surface mount technology uses solder balls rather than a solder paste to provide the solder connecting structures. By using solder balls, a more exact and somewhat greater quantity of solder can be applied than through screening. The solder balls are aligned and are held to a substrate and melted to form a solder joint on a conductive pad of the substrate. As before, the substrate with the newly joined solder balls is aligned to the board to be connected therewith and the solder balls are then reflowed to form a solder bond between substrate and board. The use of solder ball connectors has been applied to the mounting of integrated circuit chips using the so-called C-4 (control collapse chip connection) technology since the method and structure were first described and patented in U.S. Pat. Nos. 3,401,126 and 3,429,042 of Miller, which patents are assigned to the present assignee.

Solder ball connector (SBC) technology for multilayer ceramic components is designed for low cost, low induction surface mounting interconnection but is not currently pluggable into a second level socket. SBC is specifically designed for surface mount attach procedures since sockets typically require hard mating surfaces (like those found on pins) rather than the soft solder found on SBC's.

Socketing of SBC's is desirable on two accounts, however, the first is to provide module level burn-in of the semiconductor devices. The second is to provide a field upgradeable package similar to the Pin Grid Array (PGA). SBC-like packaging is being considered for X-86 and Power PC types of microprocessors and lack of pluggability remains a major hurdle to use of this technology.

In IBM Technical Disclosure Bulletin, AT 885-0235 (September 1986) the use of a copper ball surrounded by eutectic solder is shown as the joint structure for attaching a multilayer ceramic (MLC) substrate to a PC laminate wherein the ball serves as a standoff. A similar concept is described by Totta and Sopher for SLT technology as described in "SLT Device Metallurgy and Its Monolithic Extensions" IBM .JRD, Vol. 13, No. 3, pages 226–238, May 1969. Both techniques employ soldering together of two distinct components. Japanese patent no. 7,099,385 describes a manufacturing process of preventing crushing of an entire solder ball due to melting of solder and provides a simple connection structure in the gap between connection terminals by using a metallic sphere precoated with solder. The basic SBC structure and processes are described in U.S. Pat. Nos. 5,060,844 and 5,118,027, which patents are hereby incorporated by reference.

Bearing in mind the problems and deficiencies of the prior art, it is an object of the present invention to use solder ball connector technology to make electronic components having shaped socketable solder bump grid arrays for electrically connecting the electronic component to another electronic component.

It is a further object of the invention to provide an apparatus to fabricate a socketable bump grid array on an electronic component.

It is another object of the invention to provide a method for making a socketable solder bump grid array.

Other objects and advantages of the present invention will be readily apparent from the following description.

SUMMARY OF THE INVENTION

The above and other objects, which will be apparent to those skilled in the art, are achieved in the present invention which is directed in the first aspect to a method for fabricating a socketable bump grid array on a plurality of conductive pads on a surface of a substrate comprising the steps of:

providing a plurality of solder-coated metal spheres, the solder having a lower melting point than the metal sphere;

positioning the spheres into a plurality of aligning cavities in an aligning device, the aligning device having an upper surface and a lower surface and the cavities being arranged in a pattern corresponding to a pattern of the conductive pads on the substrate, the aligning cavities having tapered sides with size of the cavity being larger at the upper surface of the aligning device and wherein the taper and the opposite end of the cavity is sized so that the solder-coated metal spheres when positioned in the aligning cavities extend partially above the upper surface of the aligning device;

placing a substrate having conductive pads thereon in rough alignment to the positioned metal spheres so that at least a part of each solder-coated metal sphere contacts a corresponding conductive pad on the substrate;

maintaining the contact between the conductive pad and the solder-coated metal spheres with a minimum of force;

reflowing the solder to allow the surface tension generated by the solder to align the conductive pads on the substrate and solder-coated metal spheres;

the reflowed solder-coated metal spheres forming a tapered socketable bump whereby the base of each bump is connected to the corresponding conductive pad of the substrate by solder, and the bumps have solder coated walls having a shape corresponding to the shape of the taper of the aligning cavity and the top of each of the bumps have a coating of solder which top shape of the bump substantially conforms to the shape of the metal-sphere.

In another aspect of the invention, an apparatus is provided for fabricating a socketable bump grid-array on a plurality of conductive pads on a surface of a substrate comprising:

an aligning device having upper and lower surfaces and openings therein preferably extending through the device for positioning and securing in place a plurality of solder-coated metal spheres in a pattern corresponding to a pattern of the conductive pads on said substrate;

the openings in the aligning device having tapered sides wherein the opening at the upper surface of the device has a diameter larger than the diameter of the solder-coated metal spheres and the bottom of the taper has a diameter less than the diameter of the soldered-coated metal spheres the opening being of a size so that when the solder-coated metal sphere is positioned in the opening the sphere extends partially above the upper surface of the aligning device;

aligning means for positioning the substrate in rough alignment to said solder-coated metal spheres so that at least part of each metal sphere will wet a corresponding conductive pad on the substrate;

optional pressure means to urge said substrate against said solder-coated metal spheres with a minimum force;

whereby when the positioned solder-coated metal spheres are reflowed, the surface tension generated by said molten solder forms a socketable bump so that the base of each bump is connected to the conductive pad by solder, the walls of each bump correspond to the shape of the taper and the top of each bump has a coating of solder which coating forms a shape which substantially conforms to the shape of the metal sphere.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PERFERRED EMBODIMENT(S)

Figure 1:
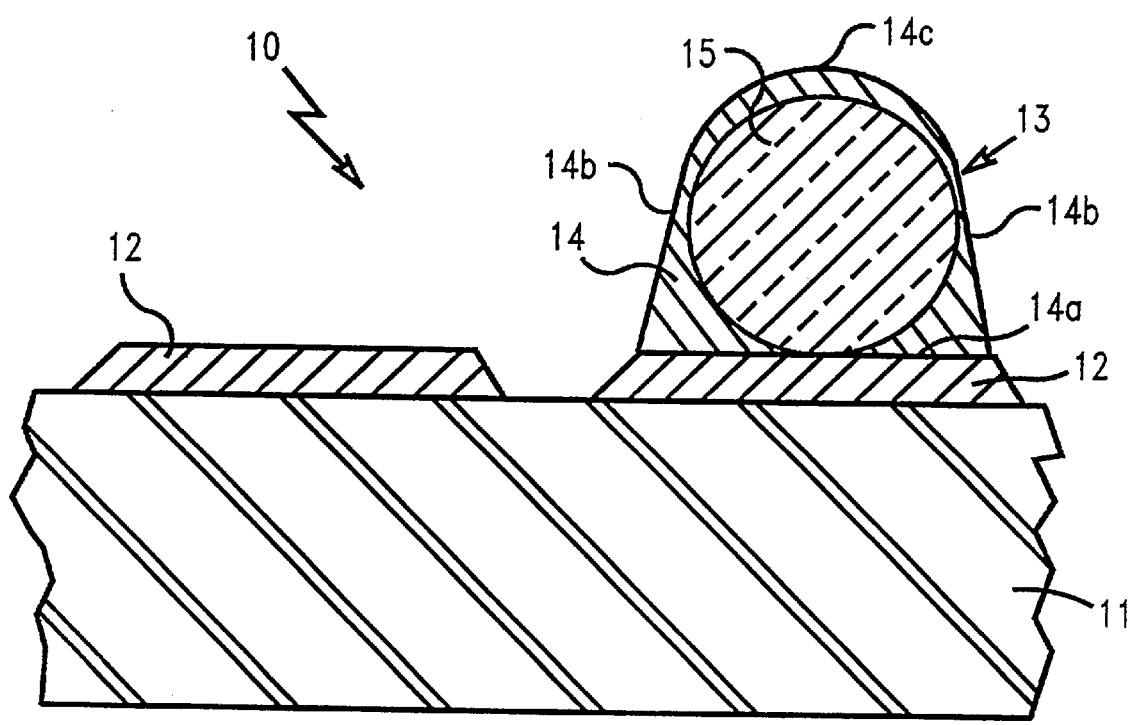
FIG. 1 shows a socketable bump shaped-solder coated metal sphere structure on a metallization pad of a multilayer ceramic substrate.

In describing the preferred embodiment of the present invention, reference will be made herein to FIGS. 1–2c of the drawings in which like numerals refer to like features of the invention. Features of the invention are not necessarily shown to scale in the drawings.

The present invention can be used for providing solder joints on substrates for connecting the substrate to another component utilizing SBC technology. In the packaging area, there are plethora of electronic structures which require connection to other similar electronic structures or to other levels of packaging. For example, integrated circuit chips might be mounted to a metallized ceramic substrate; a card on which several integrated chips had been surface mounted is then subsequently surface mounted to a board which provide interconnection circuitry to a main frame computer. For the sake of clarity and consistency, the solder ball joint of the present invention will be described as produced on a multilayer ceramic substrate which would then be pluggable into other electronic components such as circuit board.

The solder-coated metal spheres used in the invention comprise a metallic sphere having a coating of solder. For the process of the present invention, it is only required that the solder have a lower melting point than that of the metallic sphere and that the metallic sphere doesn't melt when the solder is reflowed. Any metallic sphere that can be wet by solder such as copper and nickel may be used but it is preferred to use spherical copper balls. An example of a preferred solder is eutectic solder of 37/63 weight percent lead/tin. However, there are a wide range of solder materials which would be suitable for the present invention which are well known to the solder connection part.

In general, the solder-coated metallic spheres will range in diameter from about 0.020 to 0.050 inches but 0.041 inches is preferred. Typically, the metallic sphere will be of a diameter of about 0.020 to 0.035 inches and have a solder coating of about 0.0005 to 0.005 inches. A preferred solder coated metallic sphere comprises a copper metal sphere about 0.035 inch in diameter and a 0.003 inch solder coating resulting in solder coated metallic sphere of about 0.041 inch diameter. The metallic spheres will preferably have a uniform-size with a tolerance of about ±0.001 inch. The making of copper spheres is described in the Totta and Sopher article, supra, and in general the copper spheres are made by melting somewhat irregular copper spheroids and the surface tension reshapes each mass into a nearly perfect sphere. The copper particles are usually melted with an aluminum oxide powder which help to keep most of the spheres separated during the melting process. The alumina is easily separated from the copper by screening and is recycled. The copper spheres are screened through powder metal sieves and separated into appropriate size fractions depending on the desired use. The desired range of sphere sizes is preferably fed into a micrometer separator which consists of two rotating, gradually diverging rollers and the spheres are dropped through the rollers into bins which have a grading capability of 0.0001 inch.

Likewise, solder-coated copper or other metallic spheres are produced by applying a coating of solder onto the metal sphere and grading these spheres based on the above tolerances. While several solder deposition processes are possible, a preferred method comprises using barrel plating wherein electric current is applied to the metallic spheres by intermittent contact to a rotating barrel-all of which is submerged in an appropriate electroplating bath.

The aligning device used to position the spheres during manufacture of the bump grid array substrate is a generally planar flat device having an upper surface and a lower surface with holes in the device corresponding to the desired bump grid array. The device may be made from any suitable material and graphite is a preferred material since it has a good coefficient of thermal conductivity and its coefficient of expansion is compatible with ceramic substrates. The high thermal conductivity of graphite speeds the reflow process by conducting the furnace heat to the solder joint. It also helps to maintain a consistent reflow temperature across the substrate which is important to maintain joint composition uniformity. Some ceramic materials would be compatible for the aligning device, however, they are very expensive to manufacture. Also, ceramic materials tend to be fragile while graphite is substantially stronger and resists breakage.

The aligning device may be of any suitable thickness and is generally about 0.100 to 0.500 inch thick. As will be more fully discussed hereinbelow, the aligning device has a plurality of openings or cavities into which the soldercoated metal spheres are positioned for connection to pads on a substrate to form the bump grid array. The cavities have tapered sides basically in the shape of a cone with the larger diameter of the cavity being at the upper surface of the device. The bottom of the cavity has a diameter smaller than the diameter of the sphere and the size of the cavity is such that when the solder-coated metal sphere is positioned therein that the top of the sphere partially extends above the upper surface of the alignment device. At the bottom of the cavity is an opening through which a vacuum may be applied to secure the sphere in the cavity. The diameter of the vacuum through hole is not important so long as sufficient vacuum force can be maintained on the metal sphere to hold it in place.

The alignment cavity is configured so that only a small portion of the solder-coated metallic sphere extends beyond the upper surface of the aligning device on the order of about 0.004 to 0.010 inch preferably 0.007 inch. The angle of the taper of the cavity may vary widely and is generally about 60 to 80 degrees, preferably 70 to 75 degrees. Loading of the solder-coated metallic spheres into the aligning device cavities may be done using any suitable technique such as vibratory means and is generally performed using a squeegee whereby an excess amount of spheres are placed on the surface of the aligning device and a squeegee moved across the surface of the device thereby filling each cavity with a solder-coated metallic sphere. The squeegee is brought across in contact with the upper surface of the aligning device and sweeps the excess metallic spheres away.

Use of the aligning device of the invention provides a process for producing a socketable bump grid array which is highly efficient and reliable. Fewer process defects are encountered using the present invention and the precision machining of the aligning device allows the ball to ball centrality to be maintained with high accuracy. With the process of the present invention, virtually no bridging or missing solder connections occur so long as the substrate is pressed against the solder-coated metallic sphere with a minimum of force.

Referring now to FIG. 1, a socketable bump grid array assembly is shown generally as 10. The assembly comprises a multilayer ceramic (MLC) substrate 11 having conductive pads 12 on one surface thereof. A socketable bump shown generally as 13 comprises a solder layer 14 over a metal sphere 15. The bump 13 is shown as having a base 14a in the form of a fillet which is attached to and adheres to conductive pad 12. The bump has walls 14b which are inwardly tapered from the base 14a ending in a curved shape top portion 14c which shape substantially conforms to the shape of the metal sphere 15.

Figure 2A:
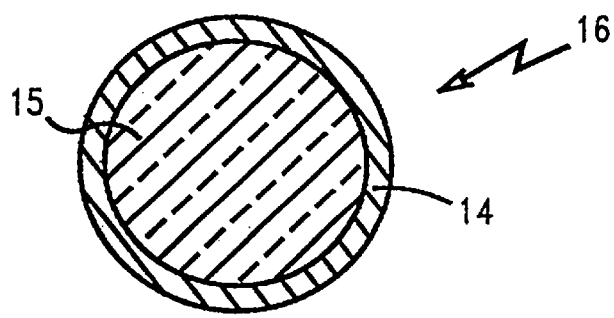
FIGS. 2A–2C show a process of the present invention for forming a socketable solder-coated metal sphere joint on the conductive pad of a substrate using an aligning device of the invention.
Figure 2B:
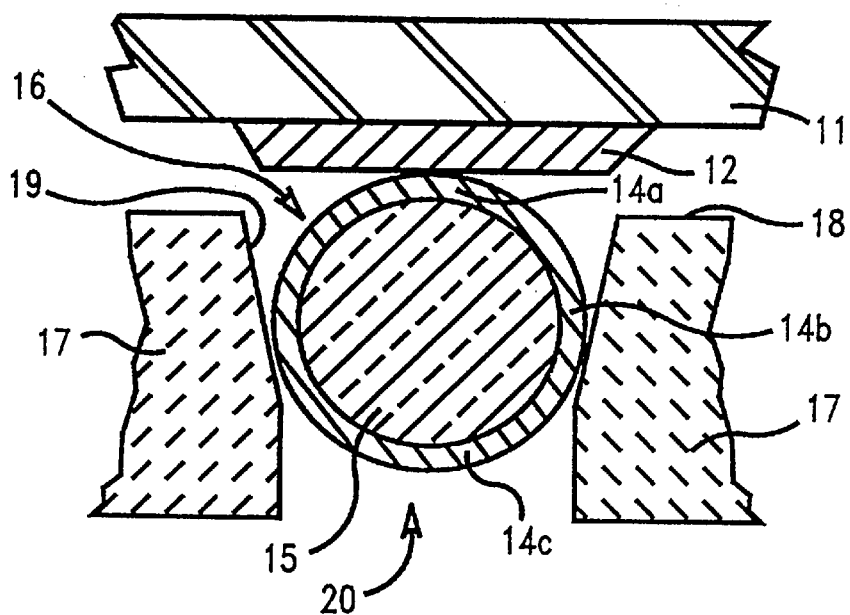
Figure 2C:
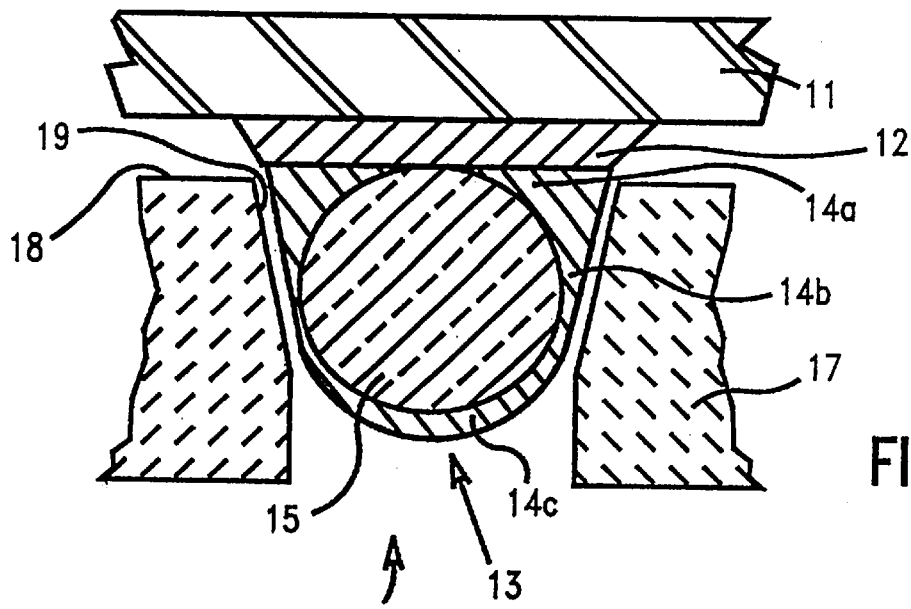

Referring to FIGS. 2a–2c, the process of the present invention is described. FIG. 2a shows a solder-coated metal sphere generally as 16 which comprises a metal sphere 15 covered by a substantially uniform solder coating 14. In FIG. 2b the solder-coated metal sphere 16 is positioned in alignment device 17 so that the metal sphere 16 extends partially above the upper surface 18 of the alignment device. A vacuum would be applied through opening 20 to hold the solder-coated metal sphere in place. A substrate 11 having a conductive pad 12 thereon is shown contacting base segment 14a of the solder coated metal sphere 16. Side walls 14b of sphere 16 are shown tangentially contacting the tapered walls 19 of alignment device 17. The top segment 14c of solder coated metal sphere 16 is shown extending into the open recess 20 of alignment device 17.

When the loaded solder coated metal sphere as shown in FIG. 2b is reflowed the solder melts (but not the metal sphere) and forms the bump 13 having the tapered shape shown in FIG. 2c. As can be seen from the figure, the lower portion of the bump 14a conforms to the shape of the conductive pad 12 and form a fillet. The bump walls 14b conform to the shape of taper walls 19 of alignment device 17. The top of the bump 14c is covered with solder and coats the metal sphere 15 which top 14c has a shape which substantially conforms to the shape of the metal sphere.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A electronic component containing a socketable bump grid array on a plurality of conductive pads on a surface of the component made by a method comprising the steps of:

providing a plurality of solder-coated metal spheres, the solder having a lower melting point than the metal sphere;

positioning the spheres into a plurality of aligning cavities in an aligning device, the aligning device having an upper surface and a lower surface and the cavities being arranged in a pattern corresponding to a pattern of the conductive pads on the substrate, the aligning cavities having tapered sides with the size of the cavity being larger at the upper surface of the aligning device and wherein the taper and the opposite end of the cavity is sized so that the solder-coated metal spheres when positioned in the aligning cavities extend partially above the upper surface of the aligning device;

placing a substrate having conductive pads thereon in rough alignment to the positioned metal spheres so that at least a part of each solder coated metal sphere contacts a corresponding conductive pad on the substrate;

maintaining the contact between the conductive pad and the solder-coated metal spheres with a minimum of force;

reflowing the solder to allow the surface tension generated by the solder to align the conductive pads on the substrate and solder-coated metal spheres;

the reflowed solder-coated metal spheres forming a socketable bump wherein the base of each bump is connected to the corresponding conductive pad of the substrate by solder, and the bumps have solder coated sides having a shape corresponding to the shape of the taper of the aligning cavity and the top of each of the bumps have a coating of solder which top shape of the bump substantially conforms to the shape of the metal-sphere.

2. The electronic component of claim 1 wherein the solder coated metallic spheres have a diameter of about 0.020 to 0.050 inches.

3. The electronic component of claim 2 wherein the metallic sphere is copper.

4. The electronic component of claim 3 wherein the aligning cavity has the shape of a truncated cone with there being an opening between the top of the cone and the lower side of the aligning device for application of a vacuum for holding the spheres in place.

5. The electronic component of claim 4 where the angle of taper is about 60 to 80 degrees.

* * * * *